(12) United States Patent
Mänz et al.

(10) Patent No.: US 7,072,821 B1
(45) Date of Patent: Jul. 4, 2006

(54) DEVICE AND METHOD FOR SYNCHRONIZING AN ASYNCHRONOUS SIGNAL IN SYNTHESIS AND SIMULATION OF A CLOCKED CIRCUIT

(75) Inventors: Martin Mänz, München (DE); Georg Zöller, Steinebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/701,593

(22) PCT Filed: May 25, 1999

(86) PCT No.: PCT/DE99/01555

§ 371 (c)(1),
(2), (4) Date: Nov. 29, 2000

(87) PCT Pub. No.: WO99/63664

PCT Pub. Date: Dec. 9, 1999

(30) Foreign Application Priority Data

May 29, 1998 (DE) .......................... 198 24 151

(51) Int. Cl.
*G06F 17/50* (2006.01)

(52) U.S. Cl. ............................ 703/19; 703/16; 713/400
(58) Field of Classification Search ................... 703/16, 703/19; 327/141; 713/400, 500, 600
See application file for complete search history.

(56) References Cited

U.S. PATENT DOCUMENTS

| 5,047,658 | A | * | 9/1991 | Shrock et al. ............... 327/155 |
| 5,426,591 | A | | 6/1995 | Ginetti et al. |
| 5,517,658 | A | | 5/1996 | Gluss et al. |
| 5,537,580 | A | | 7/1996 | Giomi et al. |
| 5,579,510 | A | | 11/1996 | Wang et al. |
| 5,657,239 | A | | 8/1997 | Grodstein et al. |
| 5,809,283 | A | * | 9/1998 | Vaidyanathan et al. ........ 703/16 |
| 6,084,447 | A | * | 7/2000 | Graf, III ...................... 327/144 |
| 6,353,906 | B1 | * | 3/2002 | Smith et al. ................. 714/741 |

FOREIGN PATENT DOCUMENTS

| EP | 0 853 280 | | 7/1998 |
| JP | 407021227 A | * | 1/1993 |

* cited by examiner

*Primary Examiner*—Albert W. Paladini
(74) *Attorney, Agent, or Firm*—McCormick Paulding & Huber LLP

(57) ABSTRACT

An apparatus and a method for the synchronization of an asynchronous signal in synthesis and simulation of a clocked circuit are disclosed, in which a circuit to be simulated and tested is described with a hardware description language and the asynchronous signals present therein are marked. For producing a network list, the hardware description language is processed with a synthesis tool, in which a specific synchronization module is inserted at every marking. For testing the time behavior of the signals in the clocked circuit on the basis of the network list, a simulator implements a logic/timing simulation, in which a test of the time behavior is selectively deactivated for each inserted synchronization module. The unknown statusses that still occur are output via a display.

20 Claims, 5 Drawing Sheets

$t_s$ = Setup-Time
$t_h$ = Hold-Time

I = METASTABLE STATE
II = UNDEFINED STATE

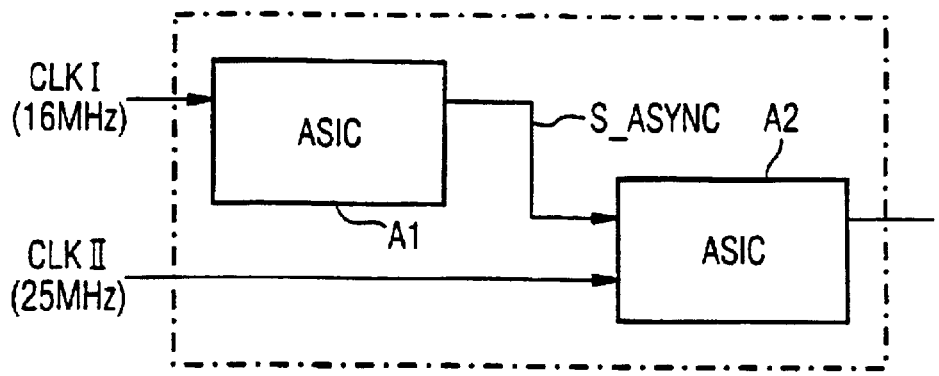
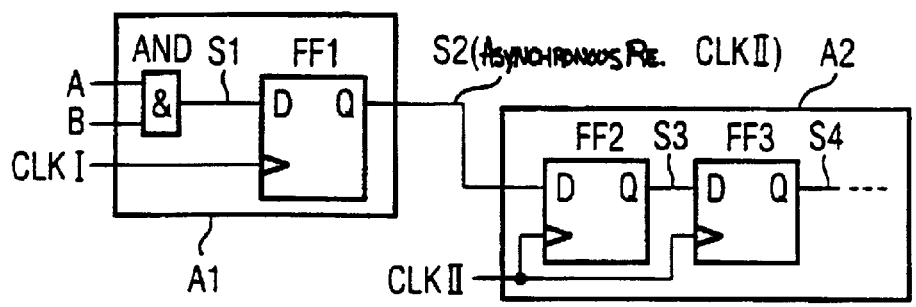
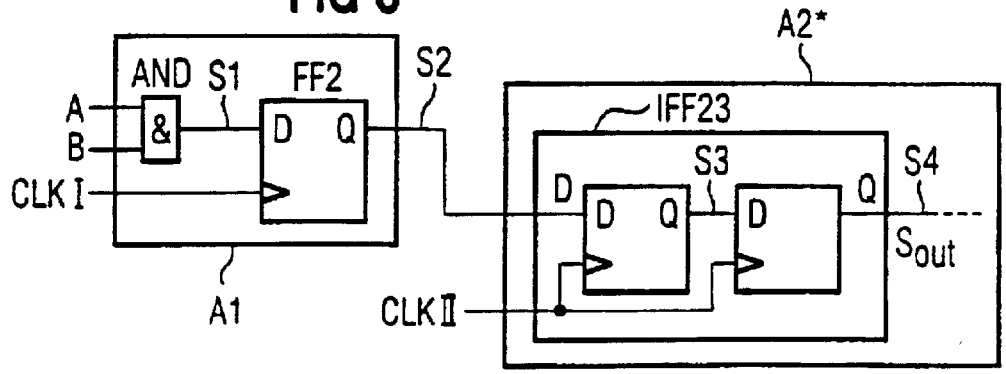

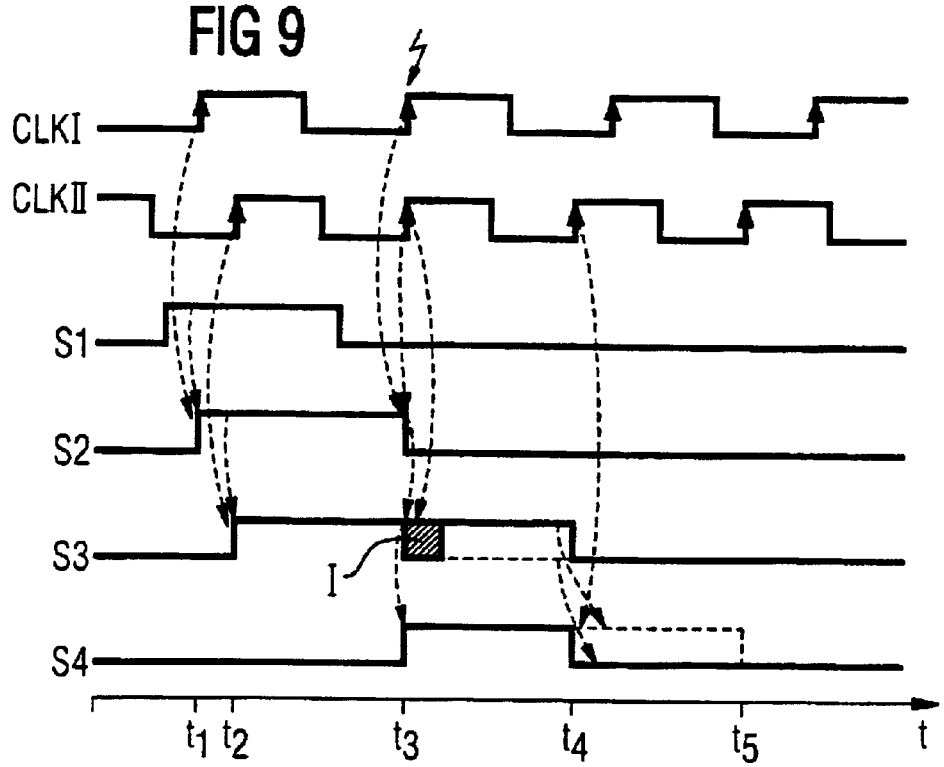
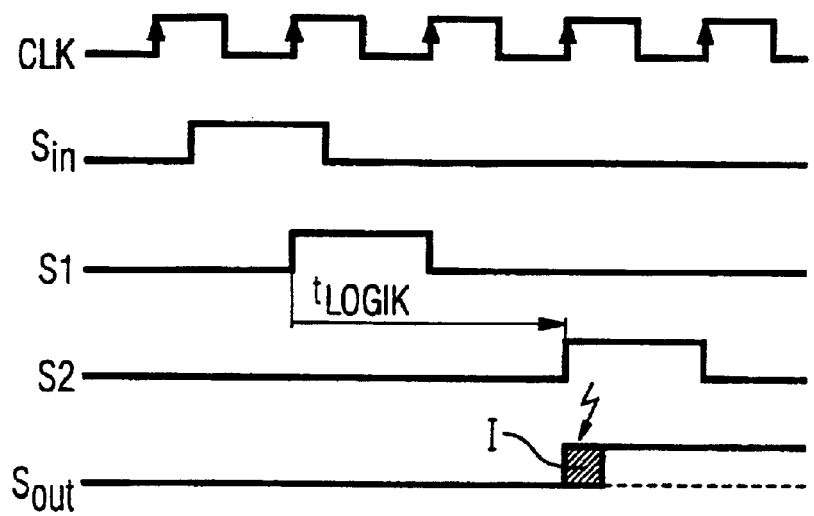

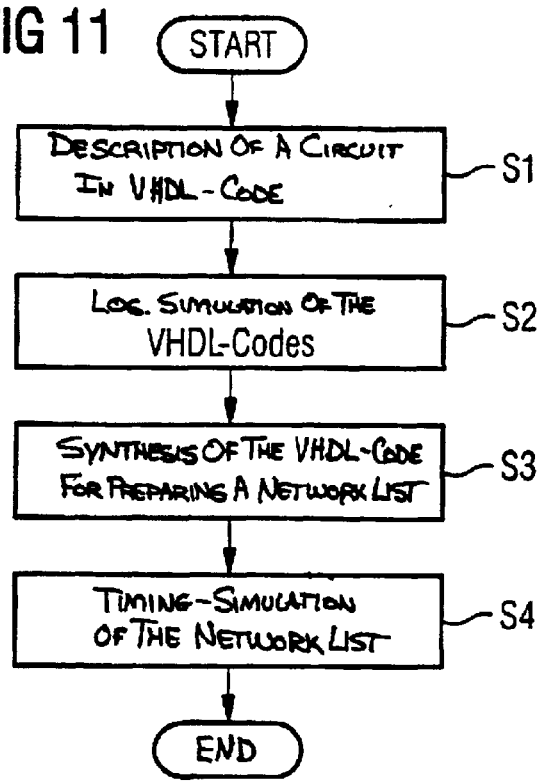
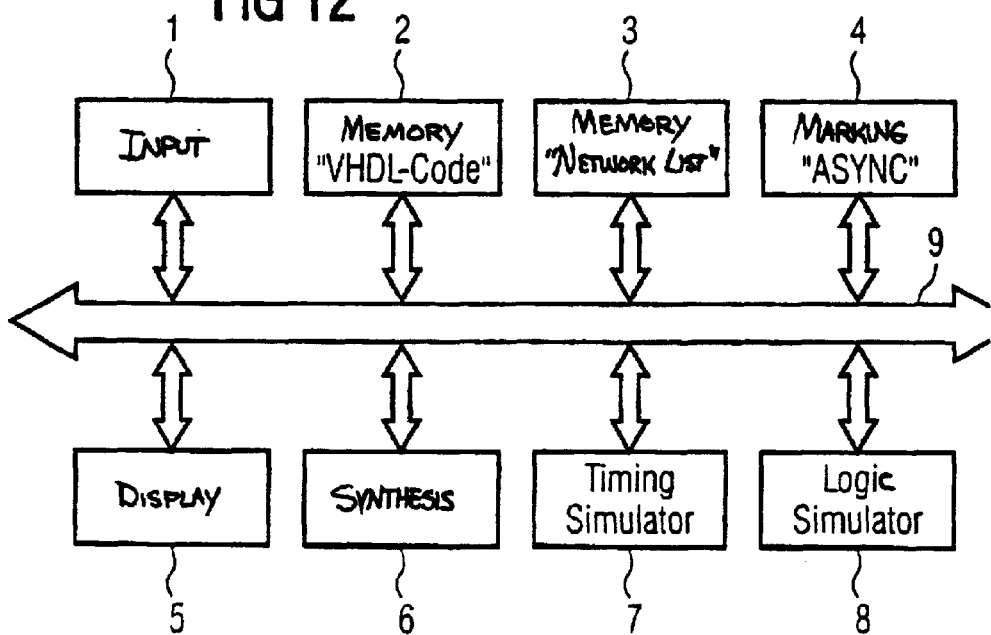

DEVICE AND METHOD FOR SYNCHRONIZING AN ASYNCHRONOUS SIGNAL IN SYNTHESIS AND SIMULATION OF A CLOCKED CIRCUIT

BACKGROUND OF THE INVENTION

1. Field of the Invention

The present invention is directed to an apparatus and a method for synchronization of an asynchronous signal in synthesis and simulation of a clocked circuit and, in particular, to an apparatus and a method with which a critical condition can be separated from an uncritical condition in the time behavior of a signal in a clocked circuit in the implementation of a simulation.

2. Description of the Related Art

Application-specific integrated circuits (ASICs), customer-specific integrated circuits (full-custom ICs) as well as their mixed forms (semi-custom ICs) are being increasingly tested for logical function and time behavior in prior to manufacture by stimulation.

A circuit is usually described for stimulation in a hardware description language such as, a VHDL code, and the logical function of the circuit is tested with a VHDL logic simulator. A test of the time behavior of the signals, however, cannot be implemented with such a logic simulator on the basis of the hardware description language (VHDL code).

For implementing a test of the time behavior of a circuit, the hardware description language (VHDL code) must be converted by a synthesis tool into a network list that represents a further code (circuit plan) of the original circuit. On the basis of this network list, the time behavior of the signals in the circuit can also be acquired or, tested with a logic/timing simulator.

Given such a test of the time behavior of the signals in the circuit or, respectively, timing simulation, time-critical signal statusses in the circuit can have been recognized and eliminated in the simulation. Such a signal status may be explained by way of example on the basis of a clocked flip-flop, but the invention is not limited to such component parts.

FIG. 1 shows a circuit diagram of a traditional flip-flop FF1 with an input terminal D, a clock input CLK and an output terminal Q. FIG. 2 shows an exemplary signal-time behavior with which no time-critical signal status occurs in the clocked flip-flop FF1. Characteristics typical of the component derive dependent on the technology employed or, respectively, on the technical realization of an electronic component (for example, a flip-flop) in a semiconductor. The characteristics critical for the flip-flop FF1 according to FIG. 1 are the setup time $t_s$ and the hold time $t_h$. These times define a time span for the flip-flop FF1 shown in FIG. 1 before and after the leading edge of the clock signal CLK at which a dependable acceptance of a signal pending at the input D ensues. Since, according to FIG. 2, the signal at the input D already has a stable value "1" before the time span $t_s$ and $t_h$, the signal at the output Q of the flip-flop FF1 is dependably set to "1" at the time of the leading edge of the clock signal CLK.

In comparison, FIG. 3 shows a signal-time behavior with which a violation of the setup time $t_s$ occurs, for which reason the output Q assumes an undefined condition. According to FIG. 3, the leading edge of the signal at the input of the flip-flop FF1 falls into the time span $t_s$ of the setup time, for which reason the signal at the output Q initially proceeds into a metastable condition I in order to then assume an undefined but fixed condition II ("0" or "1") after the time $t_m$. The metastable condition has an approximate time duration $$t_m = 5 \times t_{PD},$$

where $t_{PD}$ is the running time in the flip-flop FF1 from the clock input CLK to the output Q. The time duration for $t_m$ for the metastable condition I is dependent on the technology employed and on the semiconductor employed. After the metastable condition I, in which the output signal Q usually oscillates, the output signal Q enters into a stable but undefined condition II that is arbitrarily and randomly assumed. The same is true for a violation of the hold time.

Such unknown, i.e., metastable or, undefined conditions in the signal-time behavior are undesired since they disadvantageously influence the following circuit elements that interpret this signal and are generally referred to below as setup/hold time violations.

Particularly in the implementation of a logic/timing simulation test of the signal-time behavior of a clock circuit, the above-described setup/hold time violation has such an effect that the simulator outputs an "unknown" status for the affected signal, signals or circuit elements that are dependent on this affected signal circuit-oriented terms can no longer be tested. This leads to considerable problems in a majority of applications (e.g., an abort of the simulation).

FIG. 4 shows a clock circuit that is composed of a first ASIC module A1 and of a second ASIC module A2. The ASIC module A1 is operated with a first clock signal CLKI, for example 16 MHz, and the ASIC module A2 is operated with a second clock signal CLKII, for example 25 MHz. The clocks CLKI and CLKII are not synchronized, resulting in the problem that the ASIC module A1 outputs an output signal S_ASYNC that is asynchronous relative to the clock signal CLKII. The signal S_ASYNC is asynchronous relative to the input clock signal CLKII. Setup/hold time violations will occur in an input circuit of the ASIC module A2. For a logic/timing simulation of the circuit to be implemented according to FIG. 4, the entire ASIC module A2 thus can not be tested in view of its time behavior since there is the potential risk of setup/hold time violations at the input FF of ASIC module A2. In order to avoid such an outcome, the test of a setup/hold time violation can be generally disabled or the signal curve of the respective signals is intentionally modified for the implementation of the simulation; for example, the signal S_ASYNC is generated synchronous with the clock CLKII. A further possibility is to perform a manual intervention into the network list of the circuit to be simulated in order to selectively deactivate the test or, the setup time violation from the input circuit (flip-flop).

All of these measures, however, are time-consuming, susceptible to error, or deteriorate the simulation result since the simulation is not based on the real time behavior of the signals.

SUMMARY OF THE INVENTION

The invention is therefore based on the object of creating an apparatus and a method for synchronizing an asynchronous signal in synthesis and simulation of a clocked circuit, by which the entire circuit can be tested in a simple way with respect to setup/hold time violations.

This object is achieved by a method for the synchronization of an asynchronous signal in synthesis and simulation of a clocked circuit, comprising the steps of: a) describing the clocked circuit with a first code in a hardware description language; b) marking asynchronous signals of the clocked circuit in the first code; c) implementing a synthesis of the first code for producing a second code in a network list format, and inserting a synchronization module at every marking; d) implementing a logic/timing simulation at the second code for testing time behavior of signals in the clocked circuit, and selectively deactivating the test of the time behavior for each inserted synchronization module by adaptation in a simulation model of the appertaining synchronization module; and e) displaying occurring, undefined signal-time behavior in the clocked circuit.

This object is also achieved by an apparatus for detecting undefined signal-time behavior in a clocked circuit comprising: a) an input for a first code describing a clocked circuit in a hardware description language; b) a first memory for storing the first code; c) a marking mechanism for marking asynchronous signals in the first code; d) a synthesis mechanism that produces a second code in a network list format from the first code and stores this in a second memory, a synchronization module being inserted at every marking; e) a timing simulator that implements a timing simulation at the second code for testing time behavior of signals of the clocked circuit, the test of the time behavior being selectively deactivated for each inserted synchronization module by adaptation in a simulation model of an appertaining synchronization module; f) a display for displaying occurring, undefined signal-time behavior; and g) a bus structure that connects the input, the first memory, the second memory, the marking mechanism, the display, the synthesis mechanism, and the timing simulator to one another.

Inventively, thus a circuit is first described with a hardware description language, and the existing asynchronous signals are marked. A synthesis of the hardware description subsequently takes place for producing a network list, in which a synchronization module is inserted at every marking. A logic/timing simulation is implemented with this network list, in which the testing of the time behavior is deactivated for each inserted synchronization module. All further undefined signal-time behaviors that still occur are indicated.

Thus, clocked circuits having a plurality of signals that are asynchronous relative to one another can be completely tested in view of their time behavior without involved counter-measures for acquiring unavoidable but undefined statusses being required.

For example, an imaginary flip-flop can be inserted as synchronization module, which comprises two series-connected flip-flops, in which a setup/hold time violation test for the first flip-flop is automatically deactivated in the implementation of the timing simulation.

BRIEF DESCRIPTION OF THE DRAWINGS

The invention is described in greater detail below on the basis of exemplary embodiments with reference to the drawings.

FIG. 4 is a block circuit diagram of a clocked circuit with asynchronous signals;

FIG. 5 is a block circuit diagram of a circuit for illustrating the conversion into a hardware description language;

FIG. 6 is a diagram illustrating the inventively generated network list for the circuit according to FIG. 5;

FIG. 9 is a timing diagram illustrating the signal-time curves of the circuit according to FIG. 6;

FIG. 10 is a timing of diagram illustrating the signal-time curves of the circuit according to FIG. 8.

FIG. 11 is a flowchart of a method in accordance with the present invention; and FIG. 12 is an apparatus implementing a method in accordance with the present invention.

DESCRIPTION OF THE PREFERRED EMBODIMENTS

Figure 1:
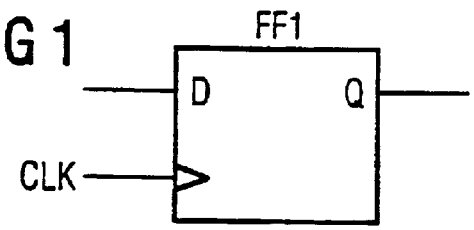
FIG. 1 is a circuit diagram of a clocked flip-flop for illustrating setup/hold time violations.
Figure 2:
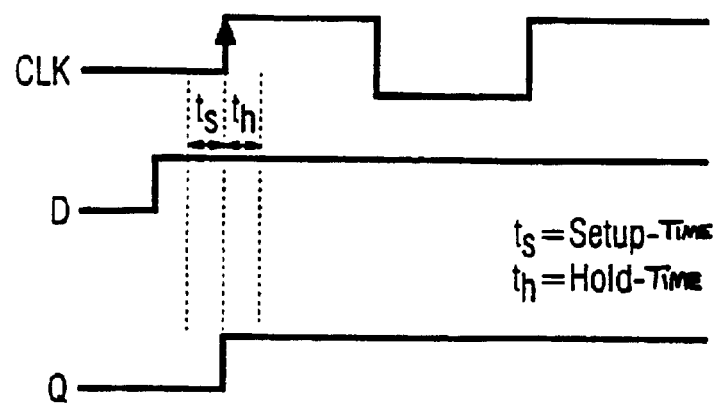
FIG. 2 is a circuit diagram illustrating the signal-time curves in the flip-flop according to FIG. 1, in which no unknown statusses occur.

FIG. 5 shows an illustration of a block circuit diagram for illustrating the functioning of the inventively method. A circuit part A1 corresponds to the ASIC module A1 shown in FIG. 4, whereas a circuit part A2 in FIG. 5 corresponds to the ASIC module A2 according to FIG. 4. The circuit is first described by a hardware description language. A frequently employed hardware description language is the VHDL code, but different hardware description languages can also be applied to the present invention. The circuit part A1 comprises an AND-gate AND and a clocked flip-flop FF1, and is described below in the VHDL code by way of example:

process A1 (CLKI)
begin
   wait until (CLKI' event and CLK="1");

$$C<=A \ \& \ B;$$

end process;
process A21 (CLKI)
begin wait until (CLKI' event and CLKI="b 1");
   S3<=S2;
end process;

process A22 (CLKII)
begin
   wait until (CLKII' event and CLKII="1");
   S4<=S3;
end process;

The circuit part A1 and A2 according to FIG. 5 is described in view of its logical function with this VHDL code. A logical test of the circuit can be performed on the basis of this VHDL code with a VHDL logic simulator.

As noted above, however, a timing simulation cannot be implemented on the basis of this VHDL code. On the contrary, a network list that serves as the basis for the logic/timing simulation must be acquired by synthesis from the hardware description language for the time analysis of the circuit according to FIG. 5.

A network list that essentially corresponds to the block circuit diagram according to FIG. 5 arises in the implementation of a traditional synthesis. Setup time violations can occur in the flip-flop FF2, since the flip-flop FF2 is supplied with a signal S2 that is not synchronous or, is asynchronous relative to the clock signal CLKII. Thus, the metastable or, undefined statusses shown in FIG. 3 can occur at the output Q of the flip-flop FF2 preventing testing of all of the following circuit regions in the circuit part A2.

FIG. 6 shows a block circuit diagram of a network list like that generated with the inventive method or, apparatus.

First, all circuit components of the circuit according to FIG. 5 are described in a hardware description language, in which all asynchronous signals are marked in a suitable way (for example, ASYNC signal S2, etc.). The VHDL code created in this way is now checked with a VHDL logic simulator in view of the logical functions of the circuit according to FIG. 5. A synthesis of the VHDL code subsequently takes place for producing a network list, in which a synchronization module an imaginary flip-flop IFF according to FIG. 6 is inserted for each correspondingly marked asynchronous signal. This synchronization module serves for the synchronization of the asynchronous signal S2. The remaining elements such as, the AND-gate 'AND' and the flip-flop FF1 remain unmodified in the network list.

FIG. 9 illustrates the critical signal-time curves according to FIG. 5. CLKI references a clock signal that is input to a flip-flop FF1 at its clock input. A signal S1 that derives from the AND operation of the signals A and B is input at he input terminal D of the flip-flop FF1. The signal S2 shows the output signal of the flip-flop FF1 that is supplied to a flip-flop FF2 at its D-input as asynchronous signal S2 (sync). According to FIG. 9, the signal S2 rises to the value "1" at the time $t_1$ when the leading edge of the clock signal CLKI is adjacent at the flip-flop FF1. Since the input signal S1 is already adjacent in stable form for an adequately long time, no unknown statusses arise. In the same way, an output signal S3 of the flip-flop FF2 is set to the value "1" at time $t_2$ when the leading edge of a second clock signal CLKII is adjacent. In this case, too, no unknown signal statusses arise for the signal S3, since the input signal of the flip-flop FF2 is already adjacent in stable form for an adequately long time.

Due to the fact, however, that the clock signals CLKI and CLKII are not synchronized with one another and, over and above this, exhibit different clock frequencies, a setup time violation of the flip-flop 2 can occur at time $t_3$. As shown in FIG. 9, namely, the leading edge of the clock signal CLKII that triggers the second flip-flop FF2 can essentially coincide with the trailing edge of the signal S2, so that no completely defined signal for the flip-flop FF2 is present in the critical time span of the setup time.

Figure 3:
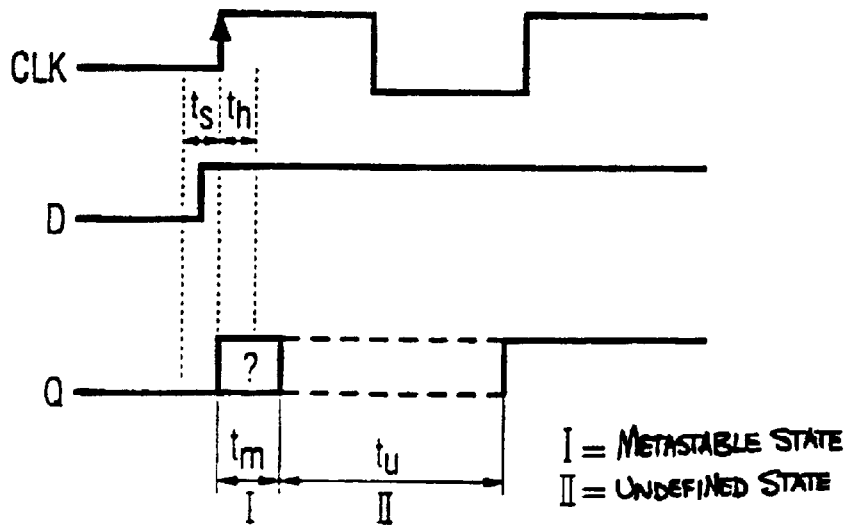
FIG. 3 is a circuit diagram illustrating the signal-time curves in the flip-flop according to FIG. 1, in which unknown statusses occur.

As was already described on the basis of FIG. 3, such an unstable condition initially produces a metastable condition with the time duration $t_m$ at the input terminal of a flip-flop, the output signal S3 oscillating during this time and then assuming an arbitrary, undefined but fixed status. This status at time $t_3$ is usually interpreted as an unknown status, creating an unknown status for all signals that depend on output signal S3.

According to the inventive method, however, an imaginary flip-flop IFF23 (synchronization FF) according to FIG. 6 is inserted into the network list at a marked, asynchronous signal in a circuit to be simulated. Setup/hold time violations are suppressed for this specific element in a suitable way (for example, with corresponding adaptations in the simulation model of the IFF23), for which reason the output signal of the imaginary flip-flop IFF23 is a defined signal and causes no problems in the logic/timing simulation.

In combination with a modified logic/timing simulation in which the test of the time behavior for each inserted, imaginary flip-flop IFF (or a part of the flip-flop IFF) is deactivated in a suitable way, a complete test of the signal-time behavior in the circuit can thus take place for a clocked circuit with asynchronous signals. All other undefined statusses to be detected, can be reliably acquired, as follows from FIG. 8.

Figure 8:
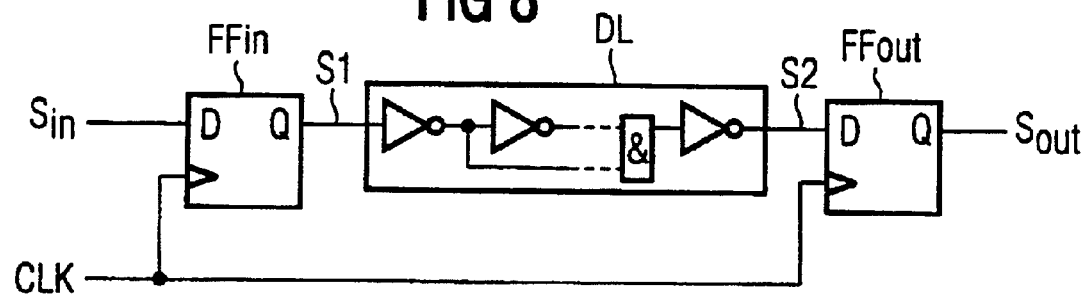
FIG. 8 is a block circuit diagram with a logic causing a setup-time violation.

FIG. 8 shows a block circuit diagram of a circuit with a faulty dimensioning of the logic DL acting a delay element that, for example, can follow at the output $S_{out}$ of FIG. 5. The faulty dimensioning of the logic DL acting a delay element effects a violation of the setup time of the following flip-flop $FF_{out}$.

FIG. 10 shows an illustration of the signal-time curves of the critical signals according to FIG. 8, in which the time $t_{LOGIK}$ represents the delay time of the logic DL. According to FIG. 10, setup/hold time violations can likewise occur at the input of the flip-flop $FF_{out}$ given poor dimensioning of the logic DL. According to FIG. 8, an input flip-flop FFin and an output flip-flop FFout are clocked with the same clock signal CLK. An input signal $S_{in}$ is set to "1" with a leading edge of the clock signal CLK and is again set to "0" with the next leading clock edge. This signal S1 is supplied to the logic circuit DL that is located between the input flip-flop FFin and the output flip-flop FFout. Due to the gate running times of the logic DL, a time delay of the signal arises that can lead to a case as shown in FIG. 10 given poor dimensioning of the circuit. According to FIG. 10, the leading edge of the signal S2 delayed by the delay time $t_{logic}$ of the logic circuit DL coincides with the leading edge of the clock signal CLK, resulting in a setup time violation. Due to the lack of an adequately stable input signal at the input terminal D of the output flip-flop FFout, an unknown status, which derives from the aforementioned metastable status and the undefined status, is obtained for an output signal Sout at the output terminal Q of the flip-flop FFout.

Such unwanted statusses can continue to be detected and localized in the logic/timing simulation, in which a synchronization module for a marked asynchronous signal is merely inserted with the inventive method and the test for setup/hold time violation is selectively deactivated.

Figure 7:
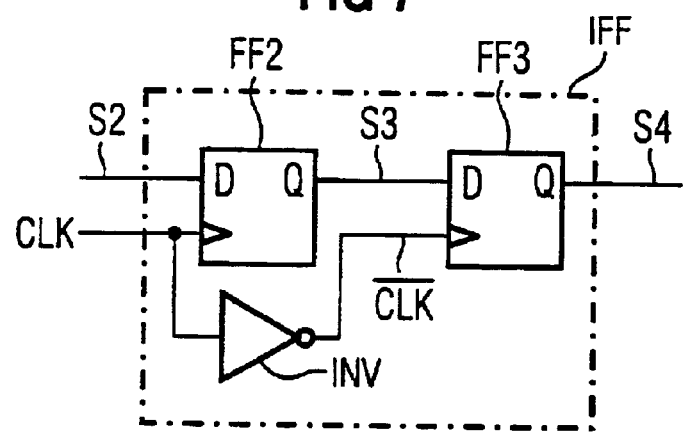
FIG. 7 is a diagram illustrating the network list of a further exemplary embodiment for the imaginary flip-flop according to FIG. 6.

FIG. 7 shows another exemplary embodiment of a flip-flop IFF to be inserted in the network list. The imaginary flip-flop or, respectively, synchronization module is again composed of a flip-flop FF2 and a flip-flop FF3, In this module, an inverter INV, however, is additionally inserted that generates the clock signal $\overline{CLK}$ by inverting the clock signal CLK supplied to the flip-flop FF2. As a result, the signal S4 output at the flip-flop 3 is already ready after one clock cycle.

The present invention has been described only on the basis of clocked flip-flops that are set with the leading edge. However, flip-flops can also be employed that are set with the trailing edge, or a system combining both leading and trailing edge flip-flops may be used. Further, the present invention is not limited to clocked flip-flops but, on the contrary, relates to all types of clocked circuit elements in which the above-described events for generating unknown statusses can occur. In particular, the employment of two flip-flops for the synchronization module inserted into the network list can be arbitrarily changed, as long as it allows a synchronization of two asynchronous signals with respect to its time behavior and—over and above this—a setup time violation can be designationally deactivated.

FIG. 11 shows a flowchart of the above-described inventive method. In a step S1, first, an arbitrary circuit for which an ASIC, a full-custom IC or a semi-custom IC, is to be fabricated is described with a hardware description language. All asynchronous signals or signal lines are thereby already marked. In the step S2, for example, a logic simulation of the VHDL code produced in this way can be implemented, by which the purely logical operations of the circuit are tested. A synthesis of the hardware description language or, of the VHDL code for producing a network list follows in step S3, in which a pre-defined synchronization module is inserted into the network list at the marked signals. A specific timing simulation is implemented in step S4 on the basis of this modified network list of the initial circuit, in which the test of setup/hold time violations is selectively deactivated for each inserted synchronization module or at least a part of this synchronization module. All undefined signal-time behaviors still occurring in the synchronous signal paths, i.e., unknown statusses following setup/hold time violations, continue to be detected and displayed. A VHDL code is preferably employed as the hardware description language in the present invention. However, all other hardware description languages can be employed in the same way insofar as they allow a marking of asynchronous signals or, signal lines. Likewise, all types of synthesis tools can be employed with which a network list can be produced from a hardware description language which permits the insertion of a synchronization module given occurrence of a marking. In the same way, all types of simulators can be employed for the timing simulations with which the inserted synchronization module or at least a part of this module can be selectively deactivated in view of the testing of the time behavior.

FIG. 12 shows an apparatus for the implementation of the above-described method. The apparatus is essentially composed of an input 1, a first memory 2 for storing the hardware description language (VHDL code) and a second memory 3 for storing the second code produced in the synthesis, i.e. the network list. A marking mechanism 4 selectively marks all asynchronous signals or, respectively, signal lines found in the hardware description language, whereas a logic simulator 8 implements a logic simulation for testing the logic functions of the circuit on the basis of the hardware description language. A synthesis mechanism 6 implements a synthesis of the hardware description language (VHDL code) that is marked and deposited in the memory 2, resulting in a modified network list arises that is deposited in the memory 3. The network list deposited in the memory 3 has the inserted synchronization modules. A logic/timing simulator 7 implements a logic/timing simulation at the network list stored in the memory 3, which is configured such that no test of setup/hold time violations is implemented in the synchronization module or parts of this module. The results acquired by the logic simulator and timing simulator are output via a display 5, and the circuit element causing the time infraction is optionally co-displayed. The elements 1 through 8 are preferably connected to one another via a bus structure 9. The synthesis mechanism 6, the timing simulator 7 and the logic simulator can be realized by one or more CPUs (central processing units) with appertaining memory units (ROMs).

The above-described method and apparatus are illustrative of the principles of the present invention. Numerous modifications and adaptations thereof will be readily apparent to those skilled in this art without departing from the spirit and scope of the present invention.

What is claimed is:

1. A method for the synchronization of an asynchronous signal in synthesis and simulation of a clocked circuit, comprising the steps of:
    a) describing said clocked circuit with a first code in a hardware description language;
    b) marking asynchronous signals of said clocked circuit in said first code;
    c) synthesizing said first code for producing a second code in a network list format, and inserting a synchronization module at every said marking;
    d) implementing a logic or timing simulation at said second code for testing time behavior of signals in said clocked circuit, and selectively deactivating said test of said time behavior for each inserted synchronization module by adaptation in a simulation model of the appertaining synchronization module; and
    e) displaying occurring, undefined signal-time behavior in said clocked circuit.

2. The method according to claim 1, comprising the further step of:
    providing a logic simulation at said first code for testing a logic function of said clocked circuit.

3. The method according to claim 1, wherein said first code represents a hardware description language and said second code represents a network list.

4. The method according to claim 3, wherein said hardware description language is a VHDL code.

5. The method according to claim 1, wherein said step of inserting said synchronization module implemented in the synthesis of said first code corresponds to inserting an imaginary flip-flop.

6. The method according to patent claim 5, wherein said imaginary flip-flop comprises a first and second flip-flop that are clocked with the same clock.

7. The method according to patent claim 5, wherein said imaginary flip-flop comprises a first and a second flip-flop that are clocked with clocks inverted relative to one another.

8. The method according to claim 6, further comprising the step of selectively deactivating a test of signal-time behavior upon said implementation of said timing simulation only for said first flip-flop.

9. The method according to claim 1, further comprising the step of displaying a circuit element causing an undefined signal-time behavior when said undefined signal-time behavior is displayed.

10. An apparatus for detecting undefined signal-time behavior in a clocked circuit comprising:
    a) an input for a first code describing a clocked circuit in a hardware description language;
    b) a first memory for storing said first code;
    c) a marking mechanism for marking asynchronous signals in said first code;
    d) a synthesis mechanism that produces a second code in a network list format from said first code and stores this in a second memory, a synchronization module being inserted at every marking;
    e) a timing simulator that implements a timing simulation at said second code for testing time behavior of signals of said clocked circuit, the test of the time behavior being selectively deactivated for each inserted synchronization module by adaptation in a simulation model of an appertaining synchronization module;
    f) a display for displaying occurring, undefined signal-time behavior; and g) a bus structure that connects said input, said first memory, said second memory, said marking mechanism, said display, said synthesis mechanism, and said timing simulator to one another.

11. The apparatus according to claim 10, further comprising a logic simulator that implements a logic simulation based on said first code for testing logic behavior of said clocked circuit.

12. The apparatus according to claim 10, wherein said first code represents a hardware description language and said second code represents a network list.

13. The apparatus according to patent claim 12, wherein said hardware description language is a VHDL code.

14. The apparatus according to claim 10, wherein said synchronization module corresponds to an imaginary flip-flop.

15. The apparatus according to claim 14, wherein said imaginary flip-flop comprises a first and second flip-flop that are clocked with a same clock signal.

16. The apparatus according to claim 14, wherein said imaginary flip-flop comprises a first and a second flip-flop that are clocked with clock signals (CLK, $\overline{CLK}$) inverted relative to one another.

17. The apparatus according to claim 15, wherein said timing simulator operates independently of time behavior for said first flip-flop in the implementation of said timing simulation.

18. The apparatus according to claim 10, wherein said display also displays a circuit element causing undefined signal-time behavior.

19. The method according to claim 7, further comprising the step of selectively deactivating a test of signal-time behavior upon said implementation of said timing simulation only for said first flip-flop.

20. The apparatus according to claim 16, wherein said timing simulator operates independently of time behavior for said first flip-flop in the implementation of said timing simulation.

* * * * *